United States Patent [19]

Chrosny et al.

[11] Patent Number: 4,802,117
[45] Date of Patent: Jan. 31, 1989

[54] METHOD OF PRESERVING DATA STORAGE IN A POSTAL METER

[75] Inventors: Wojciech M. Chrosny, Norwalk; Joel Maybruch, Ridgefield, both of Conn.

[73] Assignee: Pitney Bowes Inc., Stamford, Conn.

[21] Appl. No.: 809,454

[22] Filed: Dec. 16, 1985

[51] Int. Cl.⁴ .............................................. G06F 11/08
[52] U.S. Cl. ..................................... 364/900; 371/10; 371/21; 371/31; 364/464.02
[58] Field of Search .................. 371/10, 21, 67, 69, 371/31; 364/200 MS File, 464, 900 MS File, 466

[56] References Cited

U.S. PATENT DOCUMENTS

| | | | |
|---|---|---|---|
| 2,688,656 | 9/1954 | Wright et al. | 178/23 |
| 3,531,769 | 9/1970 | Montgomery et al. | 371/69 |
| 3,544,777 | 12/1970 | Winkler | 235/153 |
| 3,569,934 | 3/1971 | Parr, Jr. | 371/31 |
| 3,668,644 | 6/1972 | Looschen | 364/200 |
| 3,835,312 | 9/1974 | Wilber et al. | 364/200 |
| 3,866,182 | 2/1975 | Yamada et al. | 364/200 |
| 3,978,457 | 8/1976 | Check, Jr. et al. | 364/200 |
| 4,044,337 | 8/1977 | Hicks et al. | 364/200 |
| 4,251,874 | 2/1981 | Check, Jr. | 364/900 |
| 4,281,398 | 7/1981 | McKenny et al. | 365/200 |
| 4,335,434 | 6/1982 | Baumann et al. | 364/464 |
| 4,371,754 | 2/1983 | De et al. | 179/18 EE |
| 4,481,604 | 11/1987 | Gilham et al. | 364/900 |
| 4,531,215 | 7/1985 | Ladewski et al. | 371/67 |
| 4,639,920 | 1/1987 | Kaneko | 371/31 |
| 4,670,880 | 6/1987 | Jitsukawa et al. | 371/367 |

Primary Examiner—Gary V. Harkcom
Assistant Examiner—Randy W. Lacasse
Attorney, Agent, or Firm—Michael J. DeSha; David E. Pitchenik; Melvin J. Scolnick

[57] ABSTRACT

A nonvolatile memory bank of an electronic memory and retrieval system is partitioned into at least three memory blocks, each block capable of storing an accounting program. The accounting program data is stored in duplicate with one copy of the data in one memory block and a second copy of the data in a second memory block. The remaining memory blocks of the partitioned memory bank are held in reserve status. The integrity of the data is preserved by comparing one data copy with the other data copy. When a difference between the two data copies is detected, a determination is made as to which data copy is the correct data copy. The data in the memory block having the correct data is duplicated into a reserve memory block, forming a new set of data in a new memory block, which is then substituted for the memory block having the incorrect set of data.

26 Claims, 8 Drawing Sheets

BLOCK ADDRESS + OFFSET = EFFECTIVE ADDRESS

METHOD OF PRESERVING DATA STORAGE IN A POSTAL METER

BACKGROUND OF THE INVENTION

The present invention relates to improved electronic memory systems and more particularly to an improved electronic memory system incorporated into electronic postage meters for the purpose of maintaining a running account of the functions performed by the postage meter, particularly the accumulated amount of postage dispensed by the postage meter.

For the most part, postal meters on the market today are rental devices The meters are rented by the customer and usually retained and used on the premises of the customer.

Routine servicing of the meter, such as taking readings of the registers and/or setting postage tables is usually done in the field by Postal Service representatives or other authorized service personnel. However; when a postage meter breaks down, the down meter is returned to the owner or manufacturer and a substitute postage meter is provided to the customer. The customer renting the postage meter makes no repairs or adjustments to the meter. The customer does, however, set the postage value to be printed. Bench repairs and/or adjustments, other than routing servicing, are normally made by authorized service personnel or employees of the manufacturer authorized to make such repairs and/or adjustments.

A system of this nature requires a substantial service organization to effect exchange of the down meter and to bench service the down meter. It is also necessary to maintain a substantial inventory of postage meters available for exchange purposes. This requires a substantial investment on the part of the organization in the postage meter rental business and is reflected in the cost to the customer for his rental of postage meter.

The philosophy of the organization in the postage meter rental business was to provide a rugged postage meter which would withstand maltreatment by the customer without breakdown but still be easily and quickly repairable by their service personnel. This philosophy was reflected in the character and structure of the postage meter made for rental purposes.

Prior postage meters were essentially mechanical and relatively limited in scope. Postage values to be printed were entered into the device by the customer and printed by the meter on a label or envelope. The postage values so printed were accounted for by use of an ascending register. The register provided a record of the amount of postage printed over the life of the meter. As postage meters became more advanced, a piece count register was added to the meter to provide information on the number of pieces of mail which were passed through and printed with postage by the meter. An additional feature, which permitted pre-payment by the customer of a desired dollar amount of postage the meter may print, brought about the use of a descending register to indicate the dollar amount of postage left to be dispensed by the meter, before expiration of the pre-paid amount.

The data set forth in the various registers provide the customer with a reasonably full accounting of the postage actively handled by the meter for the customer. The ascending and the descending registers provide a running inventory of the dollar amount of postage already dispensed against the last pre-payment made and the dollar amount of postage available to be dispensed out of the last pre-payment or advanced payment of postage made by the customer, for the meter.

The electronic age brought a change in postage meters in which a central processing unit (CPU), such as a micro-computer or microprocessor, provides calculation and data flow control of postage dispensed and available, in accordance with input data provided. Devices of this nature are taught and described in U.S. Pat. No. 3,978,457. Coupled to the CPU may be a PROM, serving as a permanent memory, for storing program information and other information and a RAM, serving as a temporary memory, for routine storing and working data in real time in coordination with calculations and operations carried on and/or controlled by the CPU. In postage meters, where it is very important to provide permanent and/or non-destructive storage location for accounting data, such as postal funding data, for example, a nonvolatile memory (NVM) is also coupled to the CPU. NVM storage has been used successfully over other known mass data storage devices such as magnetic tape or discs, which are not as secure as NVM storage and are more expensive than NVM storage devices. The use of the NVM storage device in association with a microcomputer is disclosed in U.S. Pat. No. 4,335,434, which describes how to avoid loss of data deposited in a memory device, when the system inadvertently loses power, by use of energy stored in capacitors to provide power to the microcomputer and NVM to enable continued operation for a short period during power loss.

U.S. Pat. No. 4,481,604 describes another arrangement in which battery backed, dual identical CMOS memories, which are essentially NVM devices, are used both for real time accounting registers and for permanent data storage. In the '604 patent, dual, identical battery backed CMOS memories are utilized for storing the same data in corresponding registers thus having a duplication of data in duplicate memory storage systems. The data in the respective registers is periodically compared and any difference in data is used as a non-resettable fatal error in the system, thus causing a down postage meter.

A more advanced system data storage system for use in postage meters is taught and described in co-pending U.S. patent application Ser. No. 718,618, now abandoned, assigned to the same assignee as the present patent application in which a CPU provides data flow for storage in two separate storage units, providing a main set of registers and an alternate set of registers storing corresponding data. The said co-pending application teaches that the two separate data storage units maybe separate memory devices or may be the same memory device partitioned into two separate sections.

It has been found that the transfer of data from a CPU to an NVM is subject to various errors. Various transients that may occur can cause improper reading and/or improper writing of data. It has been known for transients to result in the writing of proper data at the wrong address. While the dual storage of data system adds integrity to data storage and the said co-pending patent application provides an economical solution to the problems in dual data storage system by partitioning an NVM device into two separate sections or using two non-identical NVM devices so as to have a primary set of registers and a secondary set of registers for storing duplicated postage accounting data, it is seen that this technique goes far in solving the problems attendant data recovery but these advances do not lengthen substantially the field life of the postage meter.

The more modern philosophy in the postage meter business is to keep the postage meter in the field with the objective of reducing the service burden placed on rental costs, generating better customer satisfaction and creating better customer relations.

The present invention addresses the problem of field life of the postage meter and provides a novel improved memory system that is effectively self correcting, should a non-correctable error or malfunction occur in the NVM system which would other-wise cause the postage meter to be recalled from the field for service.

It should be kept in mind that while the present invention is described and its use explained with respect to use in a postage meter, the utility of the present novel memory system may be extended to any inventory keeping or accounting system which employs a nonvolatile memory to store data for later recovery for inventory and/or accounting or other purposes.

SUMMARY OF THE INVENTION

The present invention provides for the partitioning of the total usable capability of a nonvolatile memory into a plurality of segments or sections and initially using two such segments, one as a primary source of data depository and the second as a secondary source of data depository and retaining the other segments as backup or reserve segments, to be used in the event that a fatal or hard error should occur in the section or segment of the NVM that is then being used for either the primary or main data depository segment or the secondary or alternate data depository segment. In the event that a fatal or hard error should occur in the primary data register, the data in the secondary data register be duplicated into one of the backup or reserve segments (the third segment for example) and a new primary data depository register will be formed.

The duplication of data from a healthy or nondefective section of the memory bank to a backup section of memory bank will be referred to as Remapping or Remap.

The present invention provides for the partitioning or sectioning of a nonvolatile memory bank into individual sections, each section sufficiently large enough to contain the information anticipated to be placed and/or stored in the required registers for the accounting program. If for example, the memory device used has 64 thousand (64K) usable addresses and the accounting registers in the program require one thousand (1K) addresses to receive and/or store all the anticipated information to be written therein, such memory device could be separated into 64 sections of 1K addresses each. If, on the other hand the same 64K address memory were used and the register to be filled with data require 8 thousand (8K) addresses to receive and/or store all the anticipated data to be written therein, such memory device could be separated or partitioned into 8 sections of 8K address each.

It has been found that an accounting program for a postage meter may require as few as 254 bytes or addresses in a memory bank. Such accounting program may include depositing, at predetermined locations in the memory bank, such as at predetermined offsets from a decimal point address identifying the particular memory section or block, for example, dollar value and/or numerical value representations representing respective values for an ascending register, a descending register, a piece count register, a batch count register and any other appropriate information.

In practicing the invention, successful results have been obtained using a CMOS memory device manufactured by Mostek, having manufacture's part number MK48C021 and a SEEQ memory device manufactured by SEEQ, having manufacturer's part number 5516AH, both memory devices being indentified as nonvolatile memory devices, having at least 2032 usable bytes or addresses. When using such memory devices for such an accounting program the total memory bank may be partitioned into eight (8) segments or blocks of 254 bytes each. Thus, from a single memory device of the type used, eight (8) memory blocks, identical in size, with each having sufficient space for depositing and storing a desired accounting program is provided.

If the desired program is larger or smaller than defined above or the memory bank used has more or fewer memory bytes, the memory bank may be partitioned into a more appropriate number of segments. So long as each segment has sufficient capacity to contain the desired program it is not necessary that the segments of the partitioned memory bank be identical in size or have the same quantity of bytes.

In practicing the invention as set forth above, the first of the eight memory areas or blocks may be used for the primary or main memory and the second such area maybe used for the secondary or alternate memory. The other six memory areas, each defined by a range of addresses, may be held in reserve or held available as back up memory areas for use in event that the primary memory or the secondary memory should experience a malfunction or there should be an uncorrectable error occurring in the transfer of data into either the primary memory section or the secondary memory section. If a malfunction or an uncorrectable error should occur in either the primary memory or the secondary memory the data in the memory section without error is duplicated in one of the reserve memory areas (the next available memory area) and a new memory, either primary or secondary depending upon which memory experience the malfunction or error, is generated to be used as a working alternate for the memory that malfunctioned. It will be seen that this remapping of a memory section may be done over and over again, depending on the overall memory capability or number of bytes in the memory device, the size of the memory area required for the program and how many usable memory areas may be sectioned out of the overall memory device.

Although other data locating systems may be used, the practice of locating a particular register on the basis of a predetermined offset for such register from the first address of the particular memory block insures that any register so located will have identical location within the block regardless of which memory block that data is directed and/or stored.

It has also been found convenient to provide each respective byte in the total memory bank with its own individual identifying number. By using a table of sequential hexadecimal numbers, each byte or address may be individually identified and located in its sequence of location in the memory bank, from the first byte to the last byte with its order of location corresponding to the numerical value or size of the hexadecimal number assigned to the byte. Each memory block or memory section may be identified by the decimal number of the first byte in the memory block.

The address or location of any particular register within the particular memory block may be obtained by adding the offset for the register and the memory block identifying number or location. Obviously the offset number would be limited to a range of numbers less than the differential between successive block addresses.

When the present invention is practiced using an accounting system employing first and second sets of identical accounting registers, it has been found convenient to use the first usable memory block of the memory bank for storing the address as of the memory blocks containing the first or primary set of registers, the primary block, for example, and the second or secondary set of registers, the secondary block, for example. Thus, the address in the block address storage identifying the location of the primary block could be changed for any reason whatsoever. This can also be done as far as the secondary block address is concerned.

The invention provides for partitioning a memory bank into multiple sections or segments or blocks, which may or may not be uniform in size. Use of two of the memory sections or blocks may be made for storing information for subsequent update and/or retrieval. The remaining unused memory blocks may be held as reserve blocks for use in the event that the blocks so used experience a malfunction or error. By depositing duplicate sets of information or data in two different memory blocks, when a malfunction is experienced in one such memory block, data in the healthy block, i.e. the block not having experienced a malfunction, may be duplicated byte-by-byte to a reserve block and a new memory block is formed. The block that experienced the malfunction is then abandoned. This process may be repeated upon the occurrence of other malfunctions in subsequent or newly made memory blocks until the last reserve block has been used.

Since some malfunctions and/or errors in data storage may result from temporary or transient conditions, re-use of previously used, subsequently abandoned memory blocks is also provided for in the event that the temporary or transient condition or conditions which caused the malfunction or error are no longer present.

A memory block previously used for storing and/or retrieving data and, after having experienced a malfunction, thereafter abandoned, may be prepared for re-use, such as by clearing the heretofore used and abandoned memory block. Clearing may be done by driving all bytes in the block memory to some uniform state, such as zero, for example.

The procedure outlined above provides for the partitioning of the total usable capacity of a memory bank into segments or blocks, use of two of the memory blocks for initially storing data, in duplication, the holding of the other of the partitioned memory blocks in reserve status, available for subsequent use should a malfunction occur in one of the currently used blocks, the provision of duplicating data stored in a healthy block by writing such data in a reserve block to form a replacement memory block for the block having experienced a malfunction. Also provided for is the re-use of blocks previously used which had experienced a malfunction and were subsequently abandoned. This provides for the fabrication of additional reserve blocks by clearing previously used, subsequently abandoned memory blocks so as to make such previously used and subsequently abandoned memory blocks available for re-use if such blocks are capable of being cleared for further use.

OBJECTS OF THE INVENTION

It is an object of the present invention to provide an improved electronic memory system capable of reestablishing itself after experiencing a malfunction.

Another object is to provide a novel use of a memory bank.

A further object is to provide an electronic memory bank which is effectively self healing should a malfunction occur.

These and other objects will become apparant when reading the following specification in conjunction with the accompanying drawings.

DETAILED DESCRIPTION OF THE PREFERRED EMBODIMENT

Figure 1:
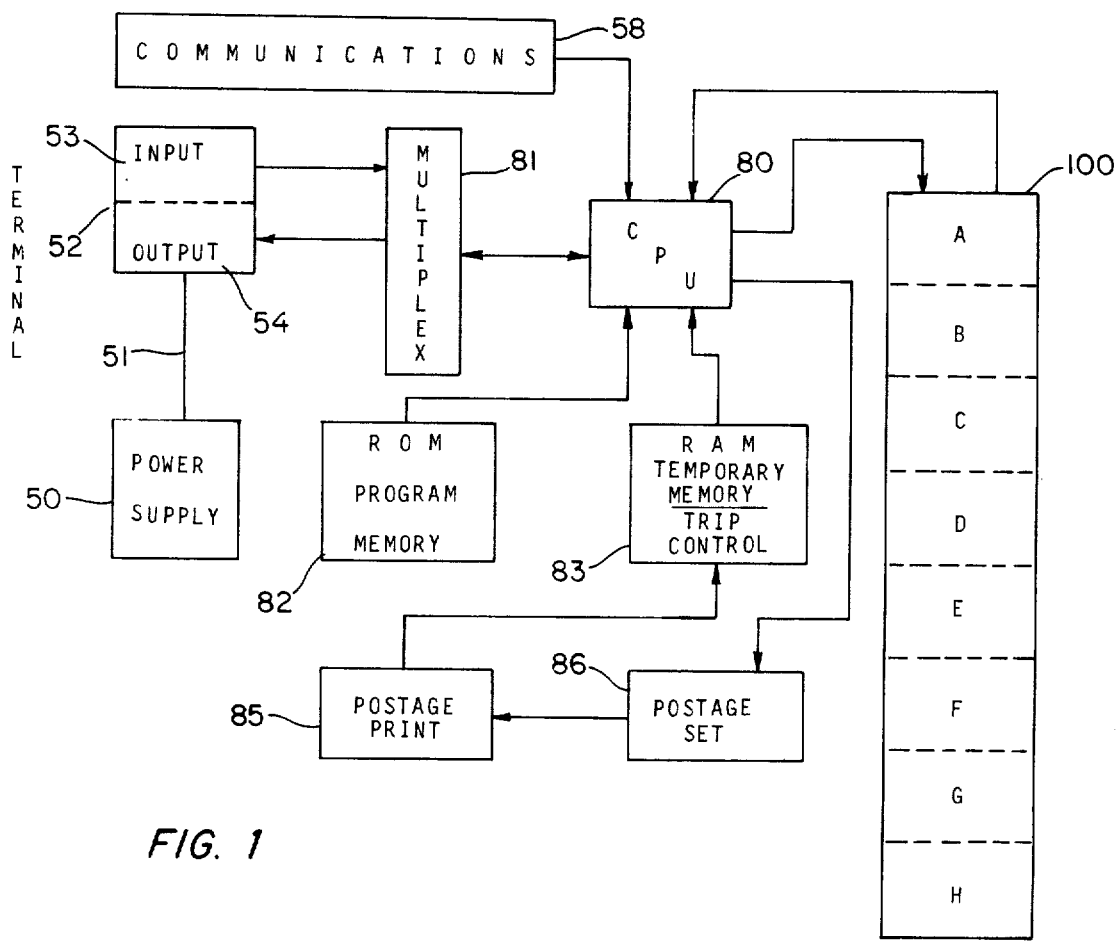
FIG. 1 is a block diagram of an electronic postal meter incorporating the present invention.
Figure 2:
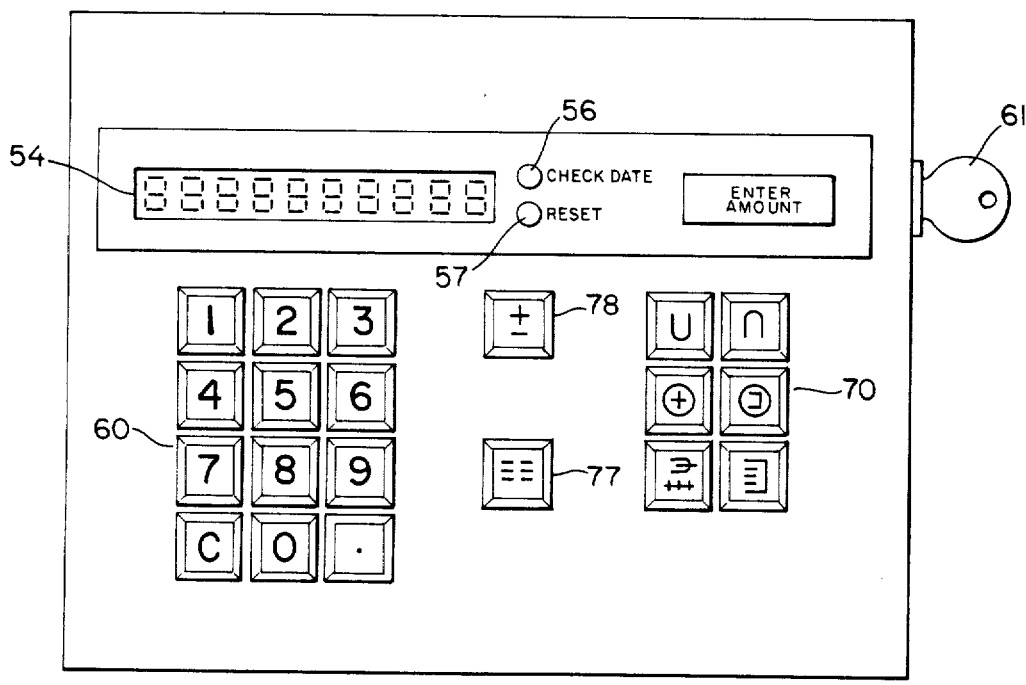
FIG. 2 is a representation of a front panel of the postal meter.

Referring to FIG. 1, an electronic postage meter is represented in block diagram form, A power supply 50 is normally connected to house current, 110 AC and may convert the AC to other voltages required to operate the meter. One type of electronic postal meter system in which, the present invention maybe utilized is described in U.S. Pat. No. 4,251,874. The power supply is represented as connected to the operating device via input lead 51. Terminal 52 includes an input 53 and an output or display 54, the front panel of which is represented in FIG. 2. The output 54 is represented by the read out shown as a series of squares within a rectangle, each square representing a display digit. The buttons 60 labeled with numbers 1 through 0, a C for CORRECTION and a period for decimal point represent part of the input section for selecting postage amounts to be printed, for example. The six buttons 70 in the right side portion of the panel may be used to interrogate the meter and ask, for example, the amount of used postage(a dollar value in the ascending register); the amount of unused postage ( a dollar value in descending register); the number of pieces on which postage has been applied; (a number in the piece count register); the number of pieces posted in a particular batch ( a number in the batch count register); the value of the postage printed in the particular batch ( a dollar value in the batch value register) and the total sum of the postage printed by the meter ( dollar value of postage printed). The other two buttons 77 and 78 may be used for other instructions, such as identify pre-paid amount of postage and select the amount of postage to be printed by the meter.

The amount, up to ten (10) figures, punched on the key board 60, including a decimal figure, will appear on the readout 54. When the number or amount is deemed correct and the function button has also been pushed, such as to change the value or amount of postage to be printed, the Enter Amount button 55 may be pushed to enter the amount into the meter. A key 61 is provided to lock and unlock the meter and buttons 56 and 57 are provided to check and reset the date printed by the meter.

Referring back to FIG. 1, the central processing unit or CPU 80 may be a microprocessor manufactured by National Semi-conductor Corporation having manufacturer's model number NSC800V. The block multiplex 81 represents the input and output linkage between the terminal and the CPU. A ROM 82, such as an off-the-shelf component model EDH7823C-30 may be serve as a permanent memory and be programmed with an appropriate program for guiding the CPU, effectively controlling the operational steps. As discussed with respect to FIG. 3, offsets for the various registers are also stored in the ROM. A RAM 83 such an off-the-shelf component model TC 551 7BP-20 or MK48COL2-25 may serve as a temporary memory. The RAM is connected to the CPU and serves as a trip control or interlock to tell the CPU when postage has been printed by the postage printing device, represented by block 85. The value of the postage to be printed is set by the postage set, represented by block 86, while postage value is controlled by the CPU. The permanent, running record or account of the postage meter functions are stored in the nonvolatile memory (NVM) represented by block 100. As more fully discussed with reference to FIG. 3, the NVM serves to store the accounting functions attendant the postage meter. Block 58, Communications represents remote terminals to which the postage meter may be connected.

Figure 3:
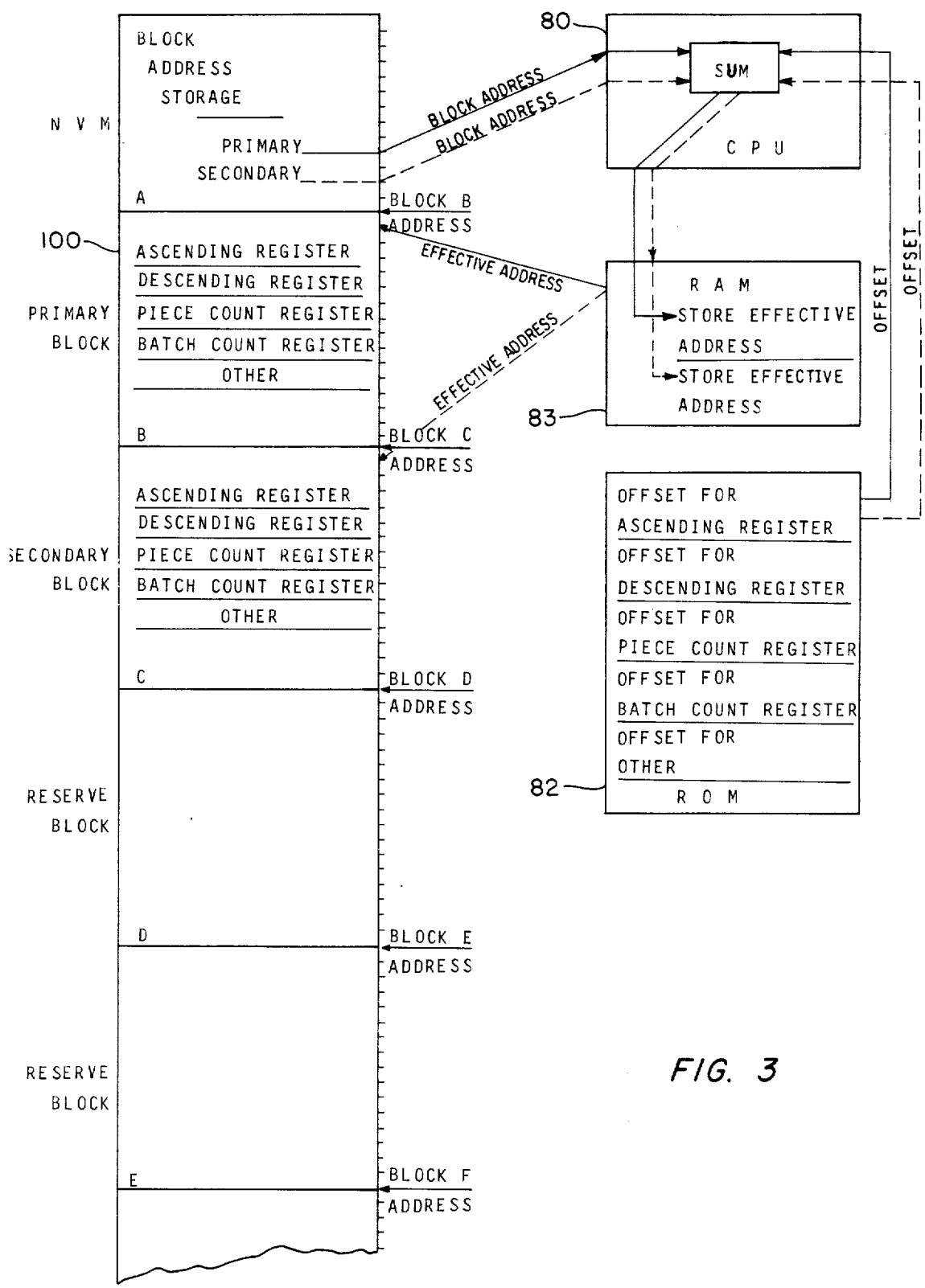
FIG. 3 is a detailed block diagram of part of the block diagram of FIG. 1.
Figure 4:
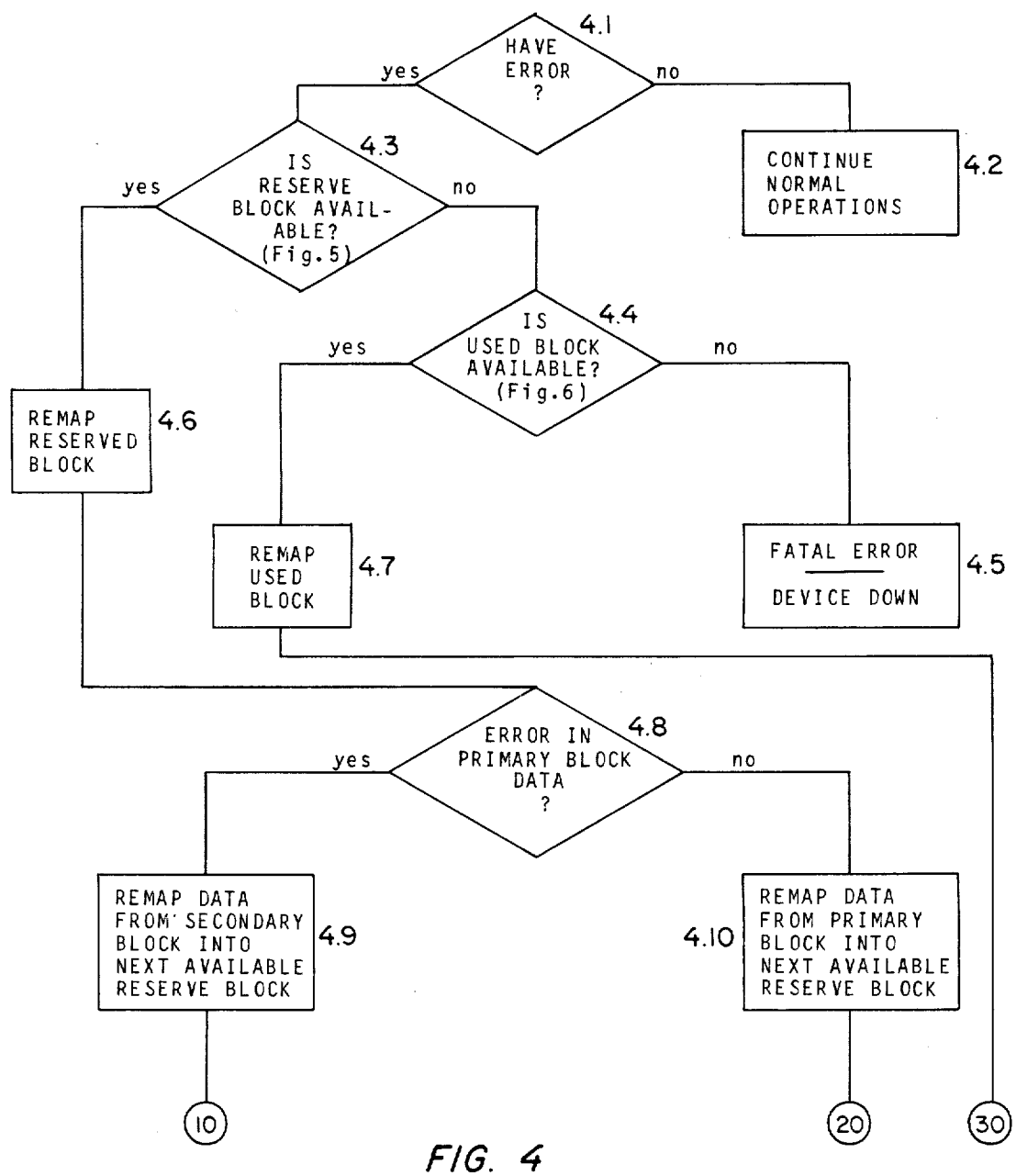
FIG. 4, 4a, 4b and 4c combine to form general flow diagram covering use of the invention.
Figure 4A:
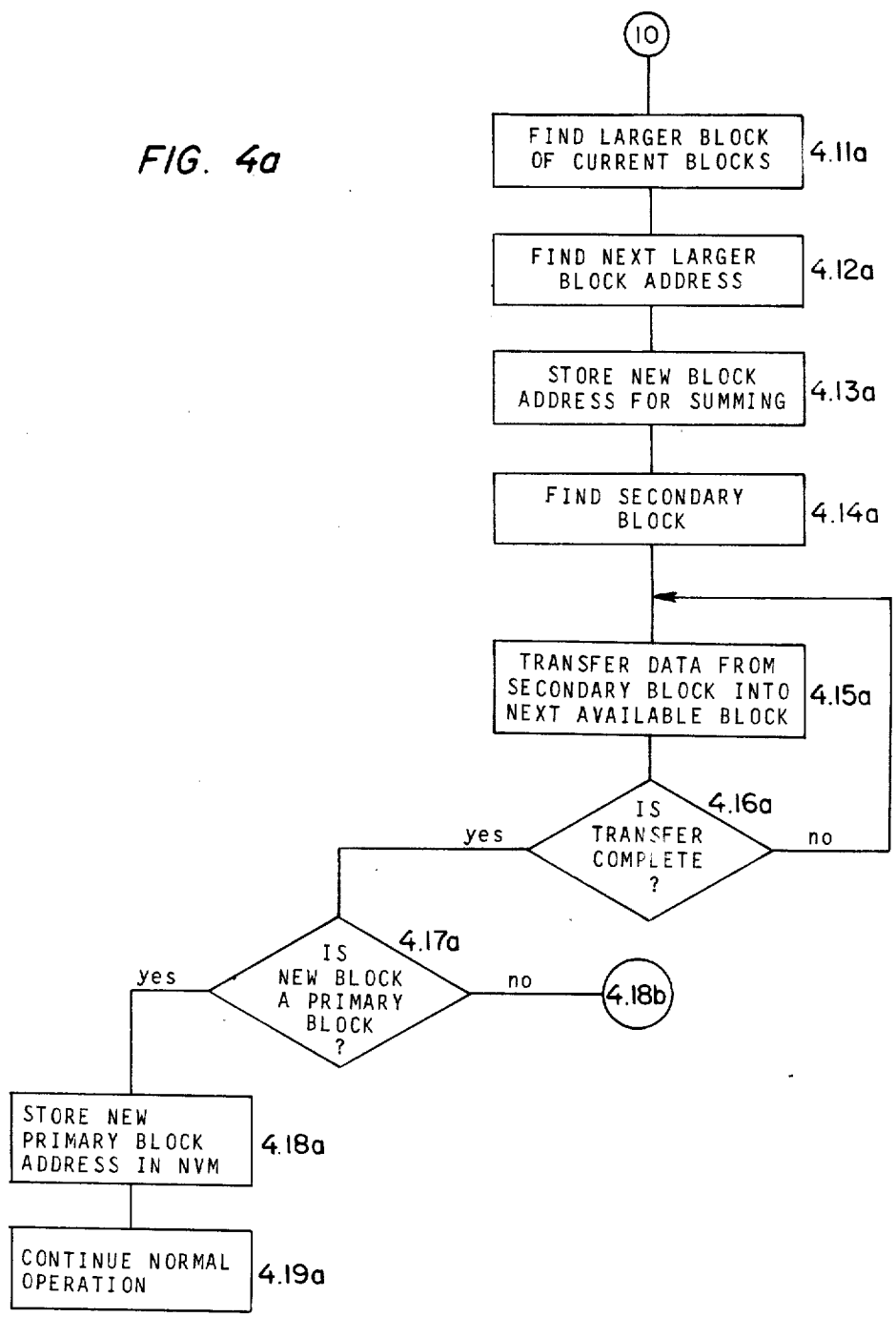
Figure 4B:
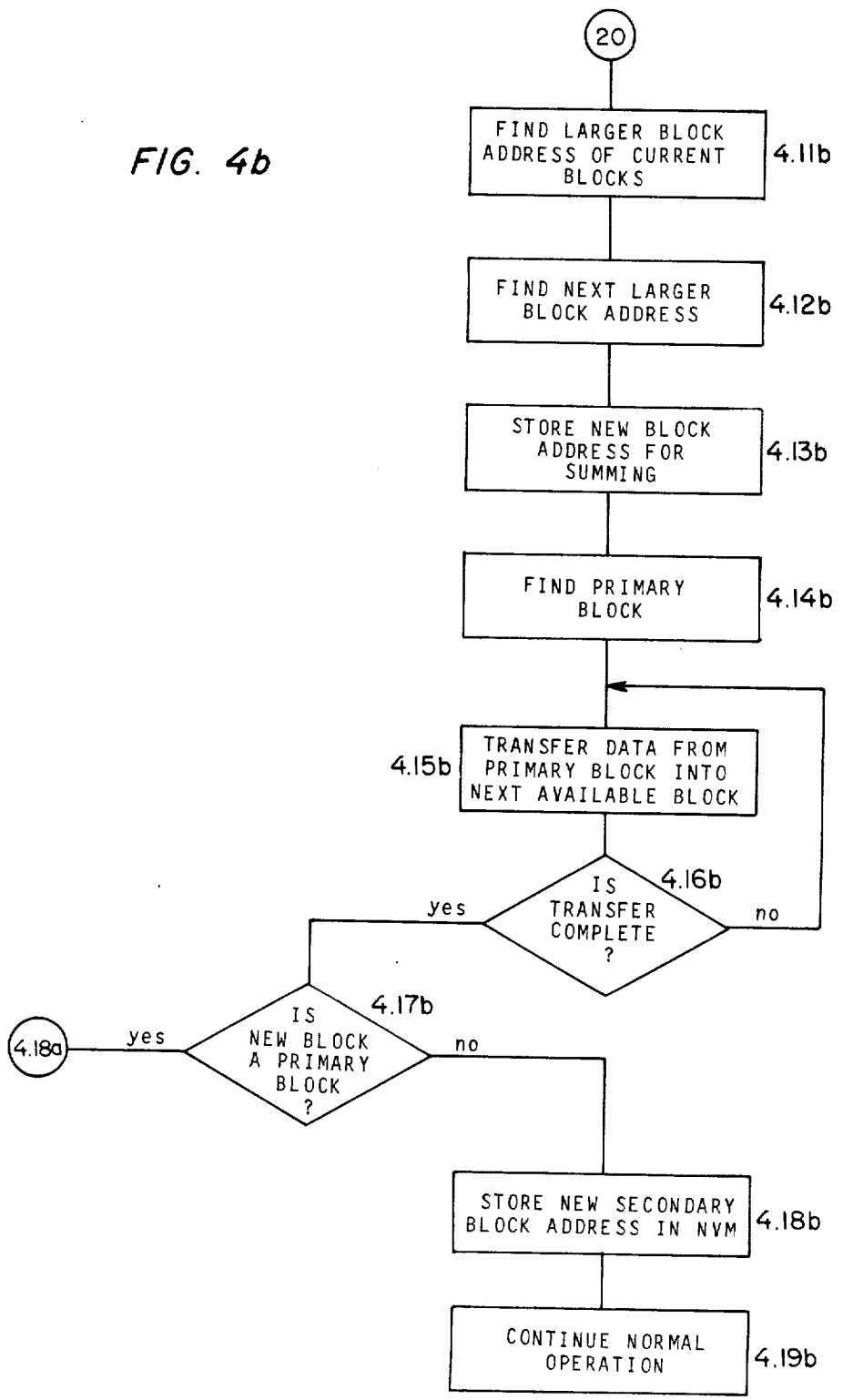
Figure 4C:
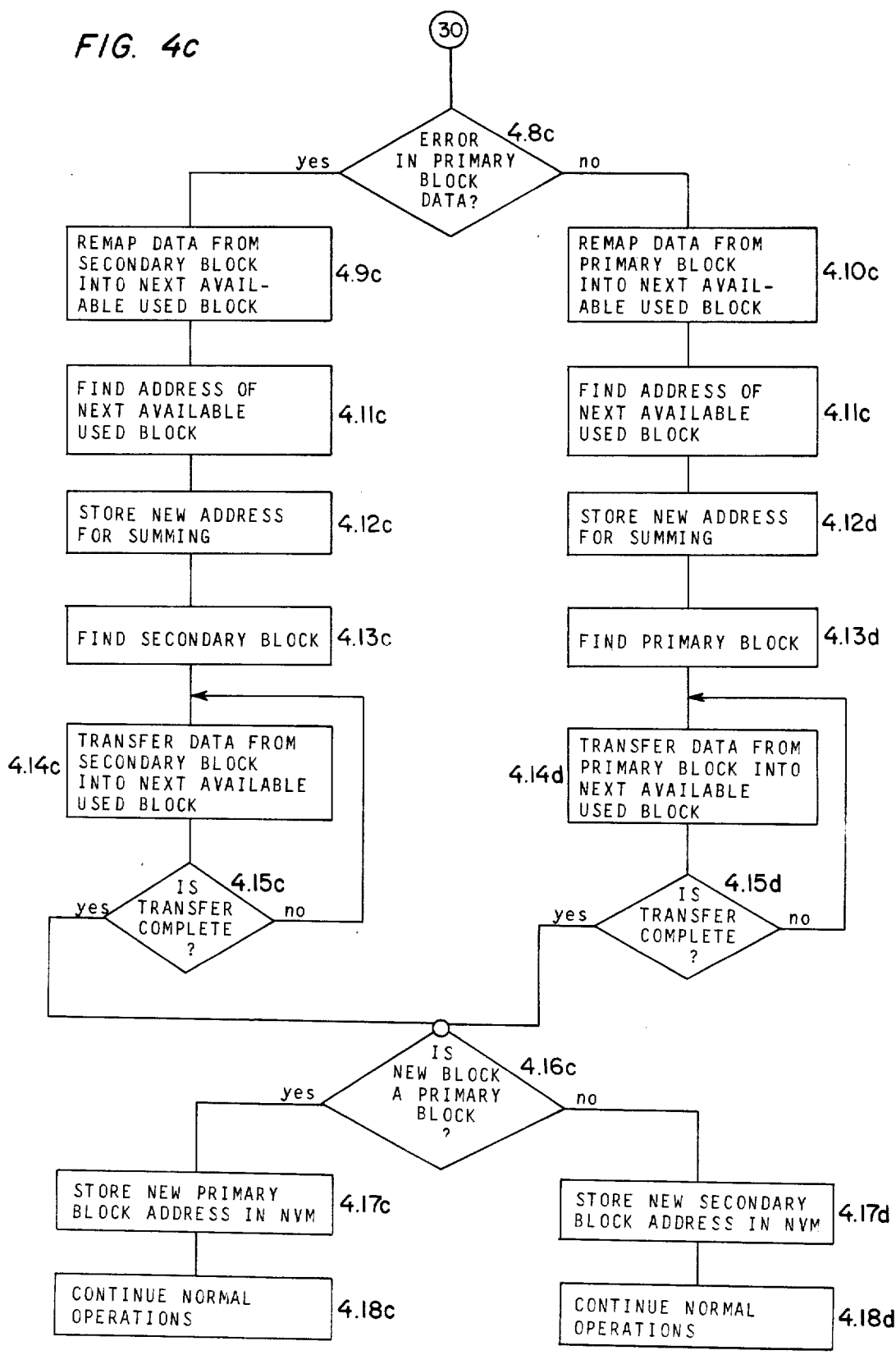

A more detailed block diagram of parts of the NVM, the ROM, RAM and CPU is represented in FIG. 3. The NVM is represented as segmented into a plurality of blocks, in this representation, 5 full blocks with the sixth block partially represented. The NVM employed maybe a CMOS, such as a model MK48C021 manufactured by Mostek which operates at very fast cycle or a SEEQ model 5516AH manufactured by Seeq, which operates at a some what slower cycle. Each memory bank includes 2032 usable memory bytes. The bytes are represented by short bars extending from the right end of the block representing the NVM. By identifying each successive byte in numerical order, the usable memory capability can be partitioned or separated into sections or blocks each containing a predetermined number of bytes, In the present representation each memory block includes an identical number of bytes, for example 254 bytes, with the memory bank partitioned into 8 blocks. This uses the total capability of usable bytes.

In actual practice, a postage meter maintains at least two identical accounting records of the activities of the meter. The records are in the form of registers such as an ascending register maintaining the dollar value of the amount of postage dispensed; a descending register maintaining the dollar value of the postage available to be dispensed against a pre-paid amount; a piece count register, maintaining a number representing the number of pieces of mail on which postage has been stamped; and a batch count register, maintaining a number representing the number of pieces of mail in a particular batch. Certainly other registers may be used if desired, thus space is provided for the same by representation.

Since duplicate sets of records or data are being kept in two separate memory blocks, the initially stored set of data in the first data memory block is referred to as the primary set of data. The data memory block in which the primary set of data is stored is referred to as the Primary Block. The initially stored set of data, which is a copy of the primary set of data, stored in the second data memory block is referred to as the secondary set of data. The data memory block in which the secondary set of data is stored is referred to as the Secondary Block. In practicing the invention the first memory block in the memory bank, which may be a shortened block, if desired, is here represented as a full block and is used to store the address of the data memory block in which the primary set of data is stored and the address of the data memory block in which the secondary set of data is stored.

In processing or verifying the integrity of the records, it may be found that one set of records has experienced an error or malfunction. In some cases, the error or malfunction may, at the time, be an uncorrectable error or malfunction. Verification of the other set of records may show this second set of records to be correct.

Since each byte in the usable memory bank has been given a number in sequential order, each successive block may be identified by the number of the first byte in the block, which is essentially the address of the particular block. The first memory block, A, may be used for block address storage thus providing predetermined addresses or locations for storing the address of the block containing the primary set of records and for the address of the block containing the secondary set of records. The second memory block B may be used as the initial block to store the primary set of records while block C, the third block may be used as the initial block to store the secondary set of records.

In the preferred embodiment, the first memory block A and the last memory block H are used for purposes other than storing sets of data or records, however such blocks would be capable of such storage. Preferably Block A is used for storing the address of the block in which the primary or main set of records is being stored, i.e., the Primary Block and the address of the block in which the secondary or alternate set of records is being stored, i.e., the Secondary Block. If the primary set of records experiences an error or a malfunction occurs in the block in which such records are stored, another set of primary records will be generated in another block and the address, stored in block A, of the primary set of records will be rewritten or changed at its location in the Block Address Storage, Block A.

In order to find an address of a Reserve Block, the differential between consecutive block addresses may be added to the highest address of the blocks in which the sets of records are actively stored.

Assume for example, an accounting program to be stored in a memory bank required 254 memory bytes and that a 2032 byte memory bank were used. Assume further that each byte in the memory bank was identified by a number in numerical sequence according to its location, from first to last in the memory bank. By segmenting the 2032 byte memory bank into memory block of 254 each, the memory bank is segmented into eight (8) memory blocks. The first memory block (Block A) may be identified by the number or address 1, the number or address used to identify the first byte in Block A. The next memory block (Block B) may be identified by the number or address 255, the number or address used to identify the first byte in Block B. Carrying this forward Block C may be identified by the number or address 509 while the fourth block (Block C) may be identified by the number or address 763. If, as in the preferred arrangement, Block A (or address 1 ) were used for block address storage and Block B (or address 255) were used as the block for initially storing the primary set of records and Block C (or address 509) were used as the block for initially storing the secondary set of records, the remaining blocks D, E, F, G and H may be used as reserve block. The addresses of the reserve blocks would be 763, 1017, 1271, 1525 and 1779 respectively, the block address differential being 254. When it becomes desirable to find the address of the next available reserve block, for example Block D, when the primary set of records are being stored in Block B and the secondary set of records are being stored in Block C, the address differential (254) may be added to the address of the highest numbered address of the then active blocks, i.e. 509+254=763, 763 address of Block D, the first reserve block in order of appearance.

The various registers, such as ascending register, decending register, piece count register, batch count register, and other register, which may constitute the set or records or data, may each be positioned at some desired location within a memory block such as at predetermined offsets from the address of the memory block. Any offset, however, must be less than the address differential. Assume the offset of the ascending register to be 30. The address of the primary ascending register would be 255+30 or 285. The address of the secondary ascending register would be 509+30 or 539. The offset of the descending register may be 60. Thus the address of the primary descending register would be 255+60 or 315 while the address of the secondary descending register would be 509+60 or 569. The block address plus the offset for the particular register is referred to as the Effective Address. The various predetermined offsets for the various registers are stored in the permanant memory, ROM, 82.

Calculations may be done in the CPU, 80 and the Effective Address stored, temporally in the RAM, 83.

FIGS. 4, 4a, 4b, and 4c combine to form a general flow chart of the operation of the device. A program for carrying out the operation set forth in the flow charts may be written and stored in the ROM. The routine to set up or generate a new set of registers, herein referred to as Remap, may occur if an error in the stored data in one set of registers is detected or if some malfunction in one of the current memory blocks is detected.

It will be appreciated by those skilled in the art that there are several ways of detecting the integrity of the data stored in the memory blocks and/or determining whether or not a malfunction has been experience by a memory block. One way to check the integrity of the data stored in the various registers is described in the said co-pending application Ser. No. 718,618.

The said copending application teaches the use of an incrementable function code individual to each register, that is stored with both the primary register and the secondary register which identifies the progress of the operation or updating effecting the particular register. One purpose of this function code is to determine if both registers have been similarly updated. It will be appreciated that when updating data stored in the registers, the data in the primary block or primary registers is first completely updated, then the data in the secondary block or secondary registers is updated. Since the data in the secondary registers should be a duplicate or copy of the data in the primary registers, the function codes of the respective registers should be identical at the completion of the update routine.

By comparing the function code in the primary block with the function code in the secondary block it can be readily ascertain whether or not both memory blocks were subjected to the same updating. A difference in the function codes of the memory blocks may indicate an error in the data stored in one of the memory blocks.

Other data checks, as well be familiar to those skilled in the art, may be used to determine the integrity of the duplicated data, if desired.

The routine covered by the flow chart set forth in FIGS. 4, 4a, 4b and 4c is followed in the event an uncorrectable error or malfunction has occurred This is represented by the step 4.1. If no uncorrectable and/or malfunction is detected normal operation continues. If, on the other hand, an error is experienced, it must be determined whether or not a reserve memory block is available for use in generating a new set of registers.

Figure 5:
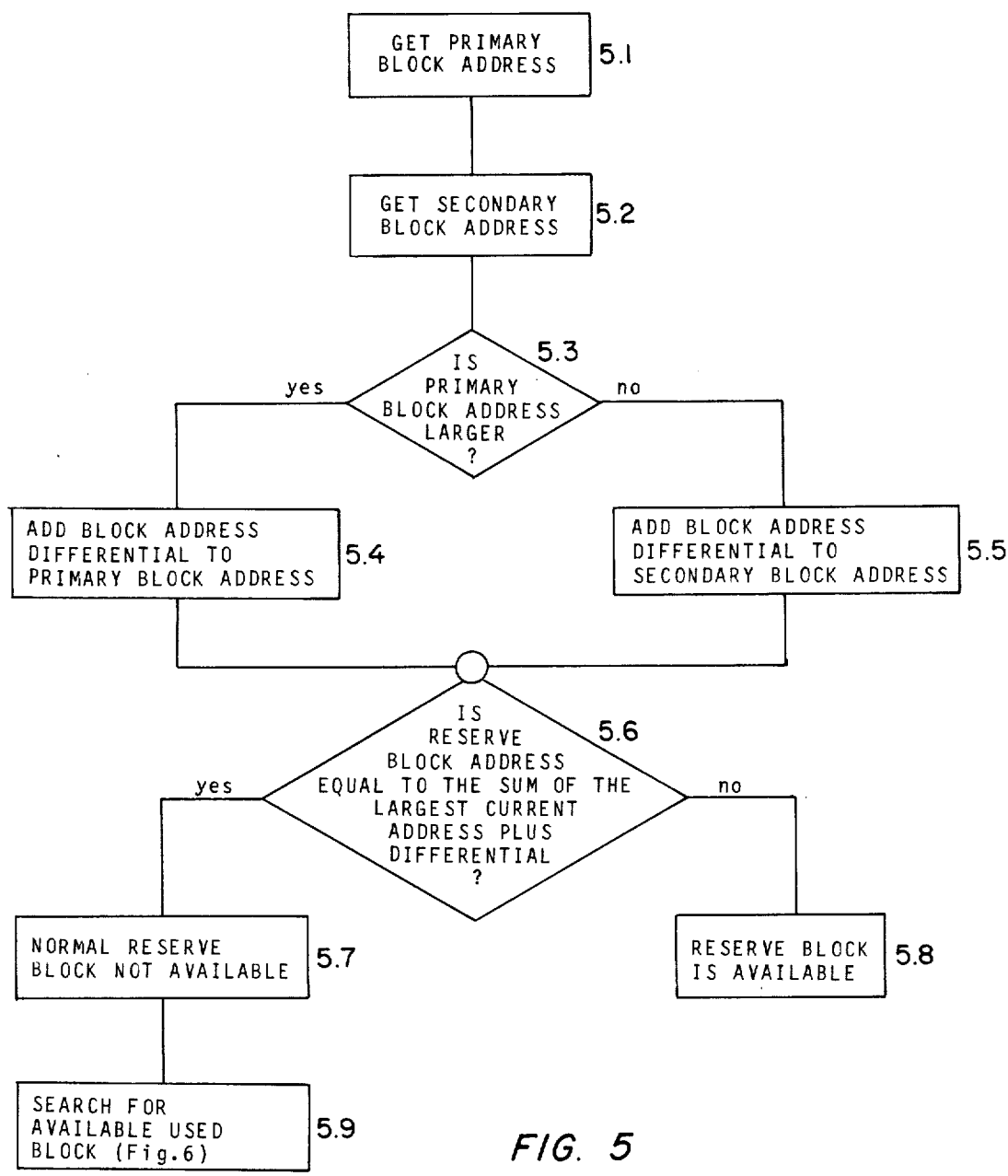
FIG. 5 is a more detailed flow diagram of a function called for in FIG. 4.

The routine to determine whether or not a reserve block is available for use is covered by the flow chart set forth in FIG. 5 It is believed that the flow chart in FIG. 5 is self explanatory. This routine will determine whether or not a reserve block is available. If a reserve block is available, the available reserve block will be remapped byte-by-byte until a new primary, or secondary memory block is generated.

Figure 6:
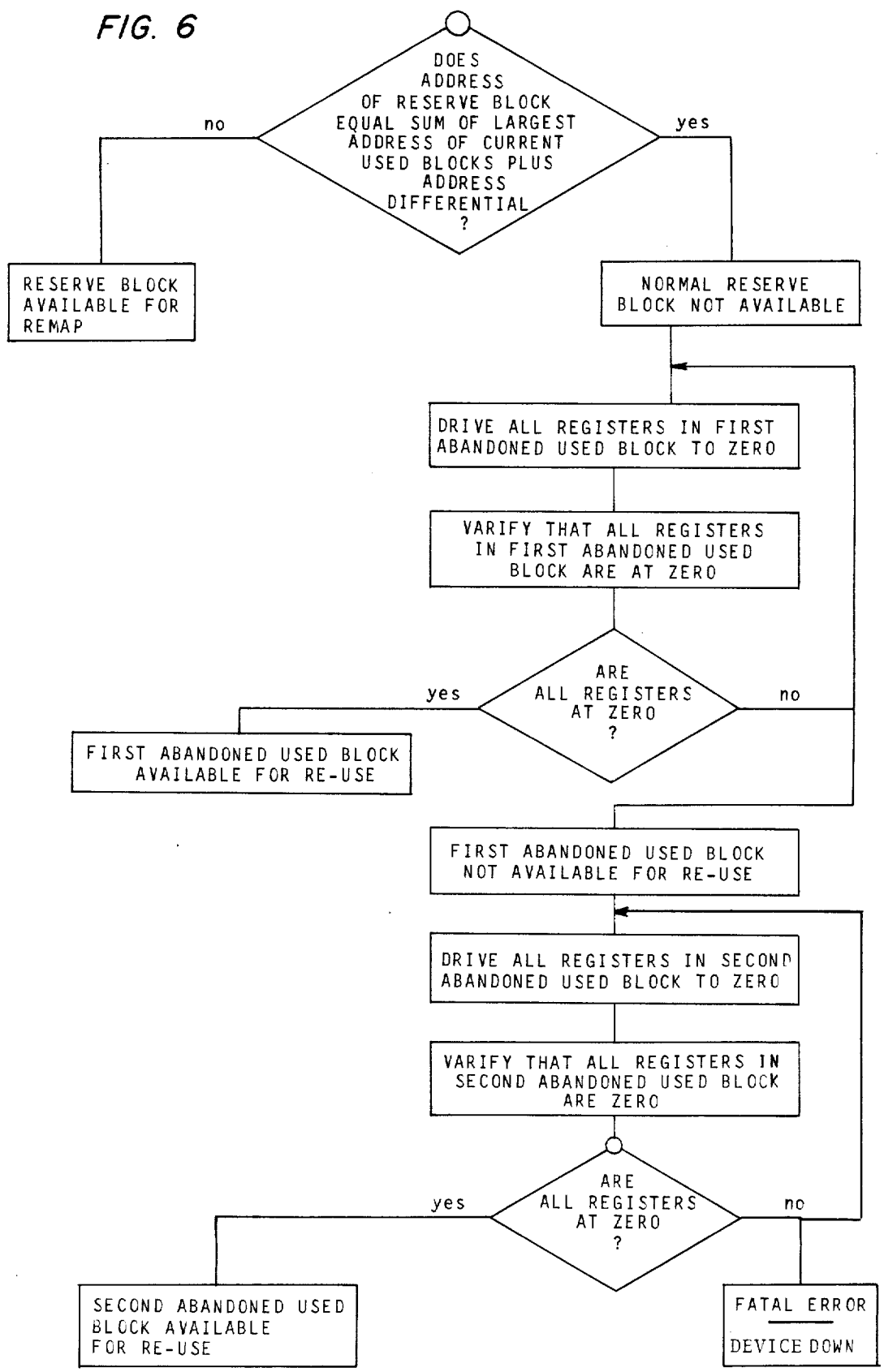
FIG. 6 is a more detailed flow diagram of another function called for in FIG. 4.

In the event that no reserve block is available a routine is provided to determine whether or not a previously used and now abandoned memory block is available for re-use. This routine is covered by the flow chart set forth is FIG. 6.

By partitioning the memory bank into multiple sections, two sections may be used to store corresponding data while other sections may be used a reserve memory blocks or areas. When an error is found in the data stored in one memory block a new set of data may be generated from the set of correct data in the other memory block by byte-by-byte duplication of the data into the available reserve memory block or area. This routine may be repeated over and over again, so long as there remains a reserve block or reserve area in which to transfer and store data in order to make a new set of registers. The carrying out of this routine may greatly extend the field life of the device in which such new memory system is employed.

As is well known by those skilled in the art, some malfunctions and/or errors appear uncorrectable at the time of occurrence but the memory block experiencing the apparent malfunction or error may in fact be driven to a state of usefullness. Thus, in the event that all the reserve blocks or areas have been used for remapping and no reserve block or area is available for use for remapping, a routine can be programmed to determine whether or not a previously used and subsequently abandoned memory block is available for re-use for remapping.

This latter procedure may further extend the field life of the device in which the present novel memory system is employed.

In an alternate arrangement the principle of the present invention may be used to reposition or re-locate a register which has sustained an error in data to another location within the same memory block without rewriting the entire set of registers stored in the block. Such alternate arrangement may provide for reserve memory areas within the memory block, as opposed to separate areas of reserve memory block. The address of the primary block and the address of the secondary block would be stored in ROM and would be permanent. The offsets of the various registers would be stored in the NVM block address storage and the offset of the particular register would be subject to change upon relocation of the register within the memory block. In the event an individual register were re-located within a particular memory block, the corresponding register in the other memory block would also be re-located to a corresponding location. The offset of the particular register would be changed in the NVM block storage.

The preferred embodiment of the invention has been described with respect to its use in a postage meter. It will be appreciated that the novel memory system may be used in any accounting and/or inventory keeping system in which data is electronically deposited, stored and retrieved. It will also be appreciated that memory banks other than those mentioned herein may be used in practicing this invention. Although the preferred arrangement of the invention includes the partitioning of a memory bank into multiple sections for remapping, it will be apparent that a plurality of memory banks maybe used where one memory bank serves as the primary bank, to store a primary set of registers a second memory bank serves as a secondary bank, to store a secondary set of registers and additional memory banks are provided to serve as reserve memory banks for the purpose of remapping.

It should be understood that although the invention has been described in a preferred embodiment and several alternate embodiments have been suggested and explained, other changes and modifications will become evident to those skilled in the art once they have been made aware of the principles and concepts of the invention. It is therefore intended that the appended claims shall be construed to cover the disclosed embodiment, the alternate embodiments and all variations and modifications which may fall within the scope and spirit of the invention.

What is claimed is:

1. A method of relocating data stored in a memory bank comprising the steps of:
   (a) partitioning said memory bank at least a first memory part, a second memory part and third memory part;
   (b) storing first data in said first memory part;
   (c) storing second data in said second memory part, said second data duplicating said first data;
   (d) writing and storing one of said first data or said second data stored in said first or said second memory part upon determination of error in the other in said third memory part whereby said data in one memory part is duplicated in said third memory part in substitution for the corresponding data stored in the other of said memory parts; and
   (e) thereafter comparing the data in said one memory part with the data in said third memory part for determining errors in the memory parts.

2. A method of relocating data stored in a memory bank as in claim 1 and in which said memory bank is a nonvolatile memory bank.

3. A method of relocating data stored in a memory bank as in claim 1 in which said memory bank is used to store postal accounting data and in which said first data includes at least ascending register data and descending register data and said second data includes at least ascending register data and descending register data.

4. A method of extending the life of a memory system employing a nonvolatile memory bank for storing data comprising the steps of:
   (a) partitioning said nonvolatile memory bank into at least a first memory block, a second memory block and a reserve memory block, each memory block containing at least sufficient bytes for storing predetermined data;
   (b) writing and storing first data in said first memory block;
   (c) writing and storing second data in said second memory block, said second data duplicating said first data;
   (d) comparing said first data stored in said first memory block with said second data stored in said second memory block to determine if there is an error in the data stored in one of the memory blocks;
   (e) determining which memory block has experienced and error;
   (f) duplicating the data from the memory block which has not experienced an error by writing and storing said data in said reserve memory block for creating a new memory block with correct data; and
   (g) thereafter comparing the data from the memory block which has not experienced an error with the data in said reserve memory block to determine if there is an error in the data stored in one of said memory blocks.

5. A method of extending the life of a memory system as in claim 4 and in which each said memory block contains the same quantity of memory bytes.

6. A method of extending the life of a memory system as in claim 4 and further including the steps of:
   (a) identifying each said byte in said memory bank sequentially in order of its location in said bank; and,
   (b) identifying each respective said memory block by respective byte in a corresponding location in the respective memory block whereby the data written in the respective memory blocks is written atleast in accordance with the identification of such memory block.

7. A method of extending the life of a memory system as in claim 4 in which said predetermined data is postal accounting data and said first data and said second data each include atleast ascending register data and descending register data.

8. A method of extending the life of a memory system as in claim 4 and further including the steps of:
   (a) identifying each said byte in said nonvolatile memory sequentially, in order of its location in said memory bank;
   (b) identifying each respective said memory block by a respective byte in a corresponding location in the respective memory block;
   (c) assigning said first data a location in a memory block which is a function of an offset less than the number of bytes contained in the memory block having the smallest quantity of bytes therein; and,
   (d) assigning said second data a location in a memory block corresponding to the location assigned to said first data, whereby said first data is stored in accordance with the identifying number of said first memory block and the offset assigned to said first data and said second data is stored in said second block in accordance with the identifying number of said second memory block and the offset assigned to said second data.

9. A method of extending the life of an electronic memory storage and retrieval system of a postage meter comprising the steps of:

(a) partitioning said electronic memory into at least a first memory block, a second memory block and a third memory block, each block containing sufficient memory bytes for individually storing predetermined data;

(b) writing and storing first data in said first memory block for retrieval therefrom;

(c) writing and storing second data in said second memory block for retrieval therefrom, said first data and second data being duplicated;

(d) comparing said first data with said second data to determine if an error exists between said first data and said second data;

(e) determining which data is correct data;

(f) duplicating the correct data in said third memory block by writing and storing said correct data into said third memory block; and (g) thereafter comparing the data in said third memory block with the correct data of said first or said second data.

10. A method of extending the life of an electronic memory storage and retrieval system as in claim 9 and in which said predetermined data is postal accounting data and said first data and said second data each include atleast ascending register data and descending register data.

11. A method of extending the life of an electronic memory storage and retrieval system as in claim 9 and in which said first memory block and said second memory block and said third memory block each contain the same quantity of memory bytes.

12. A method of extending the life of a nonvolatile memory system of a postage meter comprising the steps of:

(a) partitioning said memory into at least a first memory block, a second memory block and a reserve memory block, each said block containing sufficient memory bytes for individually storing predetermined data;

(b) identifying each said byte in said nonvolatile memory in sequential order in order of its location in said memory bank;

(c) identifying each said memory block by the identification of a predetermined byte in the respective block;

(d) storing the identification of said first memory block and said second memory block;

(e) assigning said predetermined data a location in a memory block which is a function of an offset;

(f) storing first predetermined data in said first block in accordance with identification of said first block and said offset for said data;

(g) storing second predetermined data in said second block in accordance with the identification of said second block and said offset for said data, said first predetermined data and said second predetermined data being duplicated;

(h) comparing said data stored in said first block with said data stored in said second block for determining the integrity of said data in each said block;

(i) determining the location of correct predetermined data in response to a determination that there is a difference between said data in said first block and said data in said second block;

(j) duplicating the data in the block storing the correct predetermined data into said reserve memory block for providing a duplicate set of predetermined data in said reserve block, said data located in accordance with the identification of said reserve block and said offset of said data and, (k) storing the identification of said reserve memory block in place of the identification of the memory block containing incorrect predetermined data.

13. A method of extending the life of a nonvolatile memory system of a postage meter as in claim 12 and further including steps of:

(a) comparing said predetermined data stored in said reserve memory block with said predetermined data stored in the block storing said correct data for determining the integrity of said predetermined data in each block;

(b) determining the location of the correct said predetermined data in response to a determination that there is a difference between the two predetermined data last compared;

(c) determining if a reserve memory block is available;

(d) finding a first abandoned previously used memory block in response to a determination that a reserve memory block is not available;

(e) driving all memory bytes at all locations in said first abandoned previously used memory block to a useful state;

(f) duplicating the data in the block storing the correct predetermined data in said first abandoned, previously used memory block for providing a duplicate set of predetermined data in said first abandoned previously used block, said data located in accordance with the identification of said previously used block and said offset of said data, and (g) storing the identification of said previously used block in place of the identification of the memory block last storing the incorrect said predetermined data.

14. A method of relocating data stored in a nonvolatile memory bank comprising the steps of:

(a) partitioning said memory bank into a first memory block and a second memory block, each said block including an initial storage area and a reserve storage area, said initial storage area being sufficiently large to store predetermined data;

(b) identifying each byte in said memory bank in sequence in order of its location in said memory bank;

(c) identifying each said memory block by the identification of a predetermined byte in the respective block;

(d) storing first data at a location in said initial storage area of said first memory block in accordance with the identification of said first memory block and a first offset;

(e) storing second data at a location in said initial storage area of said second memory block in accordance with the identification of said second memory block and said first offset, said first data and said second data being duplicated;

(f) comparing said first data stored in said initial storage area of said first memory block with said second data stored in said initial storage area of said second memory block for verifying the sameness of the data stored in each blocks;

(g) determining which stored data is correct data in response to verification that a difference in data exists between said data stored in said first block and said data stored in said second block;

(h) establishing a second offset within said reserve storage area of the block storing the correct data;

(i) transferring said correct data to said second offset in the memory block storing said correct data; and (j) duplicating said correct data in said reserve storage area of the block containing incorrect data and at said second offset.

15. A method of relocating data stored in a nonvolatile memory bank as in claim 14 and in which said predetermined data is postal accounting data and said first data and said second data include atleast ascending register data and descending register data.

16. A method of extending the life of an electronic data storage and retrieval system of a postage meter employing a nonvolatile memory bank for storing data therein and retrieving data therefrom, comprising the steps of:

(a) partitioning the nonvolatile memory bank into at least a first memory block, a second memory block and a third memory block, each memory block containing at least sufficient memory bytes for individually storing corresponding predetermined program data;

(b) writing and storing first data of said predetermined program in said first memory block;

(c) writing and storing second data of said predetermined program in said second memory block, said second data duplicating said first data;

(d) comparing said first data with said second data to determine if an error exists between said first data and said second data;

(e) duplicating the correct data in said third memory block in response to a determination that an error exists between said first data and said second data by writing and storing correct data in said third memory block for providing a substitute memory block having correct data for the memory having an error in data stored therein; and (f) thereafter comparing the data in said third memory block with data in said first or second memory block having no error.

17. A method of extending the life of an electronic data storage and retrival system as in claim 16 and in which said predetermined program data is postal accounting data.

18. A method of extending the life of an electronic data storage and retrieval system as in claim 17 and in which said first data and said second data include atleast ascending register data and descending register data.

19. A method of extending the life of an electronic data storage and retrieval system of a postage meter employing nonvolatile memory bank for storing data therein and retrieval of data therefrom, comprising the steps of:

(a) partitioning the nonvolatile memory bank into at least a first memory block, a second memory block and a reserve memory block each memory block containing at least sufficient memory bytes for individually storing duplicate predetermined program data;

(b) identifying each memory byte individually and sequentially in order of its location in said memory bank;

(c) identifying each memory block by the identification of a predetermined byte in the respective block;

(d) storing the identification of said first memory block and said second memory block;

(e) assigning said predetermined program data a location in a memory block and storing said location;

(f) writing and storing the data of the predetermined program in said first memory block at the assigned location;

(g) writing and storing said data of the said predetermined program in said second memory block at the said assigned location for providing duplicate copies of data in the respective memory blocks;

(h) comparing said data stored in said first memory block with said data stored in said second memory block;

(i) determining which memory block contains correct data in response to finding that there is a difference in the data stored in the memory blocks;

(j) writing and storing the data stored in the block containing correct data in said reserve memory block at said assigned location for providing duplicate copies of the correct data, the copy in the memory block storing the correct data and one copy in the reserve memory block thereby providing a substitute memory block with correct data therein for the memory block having an error in data stored therein;

(k) storing the identification of said reserve block in place of the identification of the memory block containing the error for maintaining the integrity of the data in the data storage system and for extending the life of the electronic data storage and retrieval system and (l) thereafter comparing the data in the reserve memory block with the data in the memory block having correct data for determining whether error exists.

20. A method of extending the life of an electronic data storage and retrieval system of a postage meter as in claim 19 and in which each said memory block contains substantially the same number of memory bytes.

21. A method of extending the life of an electronic data storage and retrieval system of a postage meter as in claim 19 and in which said predetermined program data is postal accounting data including atleast ascending register data and descending register data.

22. A method of extending the life of an electronic data storage and retrieval system of a postage meter as in claim 19 and in which the said predetermined byte in the respective block is the first byte in the respective block.

23. A method of extending the life of an electronic data storage and retrieval system of a postage meter as in claim 22 and in which the assigned location of said predetermined program data is a function of an offset from said first byte in the respective block.

24. A method of extending the life of an electronic data storage and retrieval system as in claim 19 and further including the steps of:

(a) comparing the data stored in said reserve memory block with the data stored in the memory block from which the data stored in said reserve block was duplicated;

(b) determining which memory block contains the correct data in response to finding that there is a difference in data stored in the respective memory blocks;

(c) determining whether or not a reserve memory block is available in which to duplicate a set of data;

(d) finding a first previously used, subsequently abandoned memory block in response to a determination that a reserve memory block is not available;

(e) driving all memory bytes at all locations in said first previously used, subsequently abandoned memory block to a useful state;

(f) writing and storing the data stored in the block containing correct data in said first previously used, subsequently abandoned memory block for providing duplicate copies of the correct data, one copy in the said first previously used, subsequently abandoned memory block and one copy in the memory block last found to contain the correct data thereby providing a substitute memory block with correct data therein for the memory block last found to have an error in data; and (g) storing the identification of said first previously used, subsequently abandoned memory block in place of the identification of the memory block last found to have an error in data for maintaining the integrity of data stored and retrieved and extending the life of the data storage and retrieval system.

25. A method of relocating data stored in a memory bank comprising the steps of:

(a) partitioning said memory bank into atleast a first memory part, a second memory part and a reserve memory part;

(b) storing first data in said first memory part in accordance with a first predetermined address, said first predetermined address including a permanent part and a changeable part;

(c) storing second data in said second memory part in accordance with a second predetermined address, said second predetermined address including a permanent part and a changeable part, said first data and said second data being duplicated; and, (d) writing atleast part of said first data in said reserve memory part in accordance with a third predetermined address, said third predetermined address including a permanent part and a changeable part, said permanent part of said third predetermined address corresponding to said permanent part of said first predetermined address whereby said atleast part of said first data is duplicated in said reserve memory part for storing said at least part of said first data at a new location.

26. A method of extending the life of a memory system employing a nonvolatile memory bank for storing data comprising the steps of:

(a) partitioning said nonvolatile memory bank into at least a first memory block, a second memory block and a reserve memory block, each memory block containing at least sufficient bytes for storing predetermined data;

(b) writing and storing first data in said first memory block;

(c) writing and storing second data in said second memory block, said second data duplication said first data;

(d) comparing said first data stored in said first memory block with said second data stored in said second memory block to determine if there is an error in the data stored in one of the memory blocks;

(e) determining which memory block has experienced an error;

(f) duplicating the data from the memory block which has not experienced an error by writing and storing said data in said reserve memory block for creating a new memory block with correct data.

(g) identifying each said byte in said nonvolatile memory sequentially, in order of its location in said memory bank;

(h) identifying each respective said memory block by a respective byte in a corresponding location in the respective memory block;

(i) assigning said first data a location in a memory block which is a function of an offset less than the number of bytes contained in the memory block having the smallest quantity of bytes therein; and, (j) assigning said second data a location in a memory block corresponding to the location assigned to said first data, whereby said first data is stored in accordance with the identifying number of said first memory block and the offset assigned to said first data and said second data is stored in said second block in accordance with the identifying number of said second memory block and the offset assigned to said second data.

* * * * *